(12) United States Patent
Nagamatsu et al.

(10) Patent No.: US 8,569,746 B2
(45) Date of Patent: Oct. 29, 2013

(54) ORGANIC FIELD EFFECT TRANSISTOR

(75) Inventors: Shuichi Nagamatsu, Iizuka (JP);
Wataru Takashima, Kitakyushu (JP);
Keiichi Kaneto, Kitakyushu (JP)

(73) Assignee: Kyushu Institute of Technology,
Fukuoka (JP)

( * ) Notice: Subject to any disclaimer, the term of this patent is extended or adjusted under 35 U.S.C. 154(b) by 101 days.

(21) Appl. No.: 13/001,585

(22) PCT Filed: Jun. 4, 2009

(86) PCT No.: PCT/JP2009/060237
§ 371 (c)(1),
(2), (4) Date: Dec. 27, 2010

(87) PCT Pub. No.: WO2009/157284
PCT Pub. Date: Dec. 30, 2009

(65) Prior Publication Data
US 2011/0101326 A1 May 5, 2011

(30) Foreign Application Priority Data

Jun. 24, 2008 (JP) ................................. 2008-163968

(51) Int. Cl.
*H01L 29/08* (2006.01)
(52) U.S. Cl.
USPC ............... 257/40; 257/E51.005; 257/E51.006
(58) Field of Classification Search
USPC ............................. 257/40, E51.005, E51.006
See application file for complete search history.

(56) References Cited

U.S. PATENT DOCUMENTS

| | | | |
|---|---|---|---|
| 5,705,826 A * | 1/1998 | Aratani et al. | 257/40 |
| 2005/0026317 A1 * | 2/2005 | Sirringhaus et al. | 438/21 |
| 2006/0086933 A1 * | 4/2006 | Iechi et al. | 257/40 |
| 2007/0049047 A1 | 3/2007 | Fujimoto et al. | |
| 2007/0087487 A1 * | 4/2007 | Honda | 438/149 |
| 2007/0131975 A1 | 6/2007 | Shannon et al. | |

FOREIGN PATENT DOCUMENTS

| | | |
|---|---|---|
| EP | 0 299 185 A2 | 1/1989 |
| JP | 64-037057 A | 2/1989 |
| JP | 01-259563 A | 10/1989 |
| JP | 05-326923 A | 12/1993 |
| JP | 2003-119255 A | 4/2003 |
| JP | 2004-103719 A | 4/2004 |
| JP | 2004-327553 A | 11/2004 |
| JP | 2005-166713 A | 6/2005 |
| JP | 2005-535139 A | 11/2005 |
| JP | 2006-294667 A | 10/2006 |
| JP | 2007-087976 A | 4/2007 |
| WO | 2005/122233 A1 | 12/2005 |

* cited by examiner

*Primary Examiner* — Lynne Gurley
*Assistant Examiner* — Hsin-Yi Hsieh
(74) *Attorney, Agent, or Firm* — Sughrue Mion, PLLC

(57) ABSTRACT

An organic field effect transistor including an organic semiconductor layer constituting a current path between a source electrode and a drain electrode wherein the organic semiconductor layer is made of a conjugated polymer having a depletion layer and a conductivity of the organic semiconductor layer is controlled by using a gate electrode, wherein the depletion layer is formed by joining a reductive material being capable of forming Schottky contact with the organic semiconductor layer made of the conjugated polymer. There can be provided an organic field effect transistor using a conjugated polymer as an organic semiconductor and being capable of maintaining an insulation property.

8 Claims, 3 Drawing Sheets

ORGANIC FIELD EFFECT TRANSISTOR

TECHNICAL FIELD OF THE INVENTION

The present invention relates to an organic field effect transistor using an organic semiconductor made of a conjugated polymer.

BACKGROUND ART

An organic field effect transistor using an organic semiconductor as a channel region (current passage) of a field effect transistor (FET) can be fabricated inexpensively by ink-coating techniques such as screen printing compared to a FET using an inorganic semiconductor. Further, there are advantages that the organic field effect transistor is flexible and can be easily formed in a large size. Therefore, techniques for a practical use of the organic field effect transistor have been actively developed in recent years. The organic field effect transistor is classified to two types, that is, one is a low molecular type organic transistor using pentacene and so on and the other is a polymer type organic transistor using polythiophene and so on. Since the low molecular type transistor can be fabricated by vacuum deposition etc., it is excellent in reproducibility of device properties. Therefore, it has been used for a drive circuit of a display. However, the polymer type transistor is better in view of flexibility. Hence, it has been demanded to enhance performance of the polymer type transistor.

An organic field effect transistor using an organic semiconductor material utilizes insulation capacities of the organic semiconductor material for the off-state of the transistor. Since a low molecular material such as pentacene is deposited under vacuum to form a film, the obtained thin film hardly includes impurities. Therefore, the insulating state of the thin film can be easily maintained. However, it is difficult to maintain the insulating state of a thin film made of a polymer material since it is easily changed to an oxidized state, which is a conductive state, due to catalyst residues of the polymerization process, impurity ions contaminated during a wet process for forming the thin film, oxygen and moisture in the atmosphere and so on. Therefore, most conventional organic field effect transistors using the polymer material are used as a normally on-state transistor due to impurities contained in the semiconductor layer. Also, in organic transistors using the polymer material, it is difficult to control reproducibility of device properties because of the reasons mentioned above.

As a method for solving these problems, for example, there has been proposed a method using a conjugated polymer which is resistant to oxidation. However, the method has been essentially unable to control adverse affects of impurities contained in a semiconductor layer. When these impurities are contained in the semiconductor layer, a decrease in insulation properties of the conjugated polymer due to the doped impurities causes a subthreshold property to deteriorate, and transistor properties are remarkably deteriorated by hysteresis appearance due to polarization of the impurity ions. As other methods for solving the problems, there have been conducted various countermeasures such as removal of catalyst residues (metal ions) from a conjugated polymer material, thorough removal of solvent from a polymer film, thorough washing of tools for making a polymer film, production of a polymer film under a deoxygenated and dehydrated atmosphere in a globebox. However, there are restrictions in these methods that special facilities are required or thorough operations are necessary to achieve effects. Although other various methods have been proposed regarding the organic field effect transistor using the conjugated polymer material (for example, see Patent Documents 1-6), the problems set forth above have not been solved.

TECHNICAL DOCUMENTS

Patent Document

Patent Document 1 Japanese laid-open patent publication No. 1989-259563
Patent Document 2 Japanese laid-open patent publication No. 1993-326923
Patent Document 3 Japanese laid-open patent publication No. 2003-119255
Patent Document 4 Japanese laid-open patent publication No. 2004-327553
Patent Document 5 Japanese laid-open patent publication No. 2006-294667
Patent Document 6 WO2005/122233

SUMMARY OF THE INVENTION

Problems to be Solved by the Invention

The present invention is intended to solve the problems set forth above and to provide an organic field effect transistor being apt to maintain an insulating state thereof by an easy, simple and inexpensive method using a conjugated polymer material.

Means for Solving the Problems

The present invention is an organic field effect transistor comprising an organic semiconductor layer constituting a current passage between a source electrode and a drain electrode wherein the organic semiconductor layer is made of a conjugated polymer having a depletion layer and electric conductivity thereof is controlled by using a gate electrode, wherein the depletion layer is formed by contacting a reductive material being capable of forming Schottky contact with the organic semiconductor layer made of the conjugated polymer.

According to the present invention, in an organic field effect transistor with an organic semiconductor layer constituting a current passage between a source electrode and a drain electrode whose electric conductivity is controlled using a gate electrode, the organic semiconductor layer is made to a depletion state. Specifically, when a film of conductive material such as metallic aluminum with a low work function is formed on a p-type semiconductor film made of a conjugated polymer used as an organic semiconductor layer, free electrons existing in aluminum move into the p-type semiconductor film at the contact interface due to electron concentration difference. The electrons moved into the polymer film unite with acceptors that are impurities in the polymer film to form acceptor ions. At this time, the polymer transfers to a no-doping state since electrons of aluminum substitute electrons of the polymer being trapped with the acceptors. Also, space charge regions are formed due to the acceptor ions and Schottky contact is formed. As a result, a very high insulating state can be maintained because a depletion layer is formed at the contact interface.

In the present invention, because off-current can be suppressed by forming such a depletion layer in the channel region of the organic field effect transistor, it becomes possible to make a normally off-state transistor. Further, because the depletion layer changes from a high insulating state to a conductive state by supplying gate voltage, steep subthreshold characteristics can be achieved.

Effect of the Invention

An organic field effect transistor of the present invention using an organic semiconductor made of a conjugated polymer becomes a device with high impedance since the organic semiconductor layer forms a depletion layer having very high insulating properties. Also, a hysteresis of transistor characteristics can be suppressed because the impurities cannot behave as a movable ion due to being trapped with reductive materials. Further, because the organic semiconductor layer changes from a complete depletion state to an on-state, steep subthreshold characteristics can be achieved.

In a flexible display with an organic transistor that has been achieved so far, pentacene being a low molecular organic semiconductor has been used for a semiconductor layer. However, the flexible display has not been able to achieve flexible properties in the true sense since pentacene is not flexible. According to the present invention, a semiconductor using a conjugated polymer having flexibility enables to achieve transistor properties at the same level as the low molecular organic semiconductor. Therefore, development of the flexible display is expected to be accelerated.

EMBODIMENT TO CARRY OUT THE INVENTION

The present invention is an organic field effect transistor comprising an organic semiconductor layer constituting a current passage between a source electrode and a drain electrode wherein the organic semiconductor layer is made of a conjugated polymer having a depletion layer and conductivity thereof is controlled by using a gate electrode, wherein the depletion layer is formed by contacting a reductive material being capable of forming Schottky contact with the organic semiconductor layer made of the conjugated polymer.

In the present invention, the depletion layer is formed by contacting a reductive material being capable of forming Schottky contact with the organic semiconductor layer made of the conjugated polymer. As a method or means for contacting the reductive material with the organic semiconductor layer, for example, there are a method of depositing an appropriate amount of the reductive material on the organic semiconductor layer, a method of mixing it in the organic semiconductor layer and combination of these two methods. The organic semiconductor layer having the depletion layer is obtained by the method or means.

In general, a field effect transistor (FET) is a device for amplification using phenomena in which the flow of electrons and holes (career) in a semiconductor is controlled by an electric field. This device comprises three electrodes, that is, a gate electrode, source electrode and drain electrode, and has a feature that a channel region between the source electrode and the drain electrode, i.e., a current passage changes in width upon adding signals from the gate electrode, such that output current to the drain electrode is modulated.

Hereafter, the organic field effect transistor of the present invention will be explained with reference to drawings.

Figure 1:
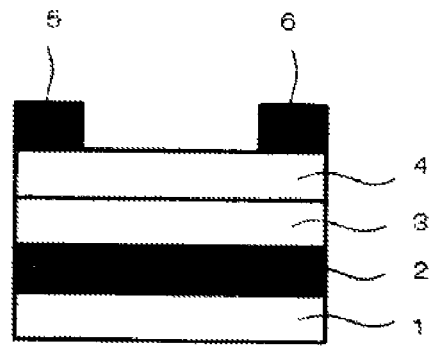
FIG. 1 is a figure showing schematically an embodiment of a typical organic field effect transistor device in the conventional art.
Figure 2:
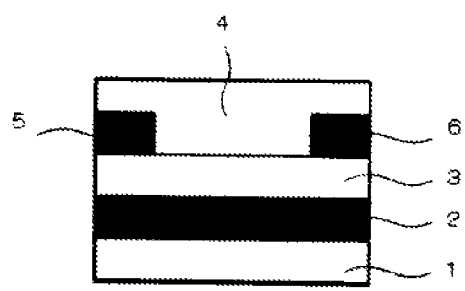
FIG. 2 is a figure showing schematically another embodiment of a typical organic field effect transistor device in the conventional art.

FIG. 1 shows an outlined cross section of an organic field effect transistor according to the present invention. This organic field effect transistor has a structure that film gate electrode 2, gate insulation layer 3 and organic semiconductor layer 4 are stacked on substrate 1 in turn, and subsequently a pair of film-like source electrode 5 and film-like drain electrode 6 is formed on organic semiconductor layer 4. The structure or form of the organic field effect transistor shown in FIG. 1 is one example of the present invention, which is not limited to that embodiment. For example, the present invention may be the embodiment shown in FIG. 2 in which numerals 1-6 indicate the same as in FIG. 1. The present invention can be applied to not only the embodiments such as FIGS. 1 and 2 but also every organic field effect transistor.

Figure 3:
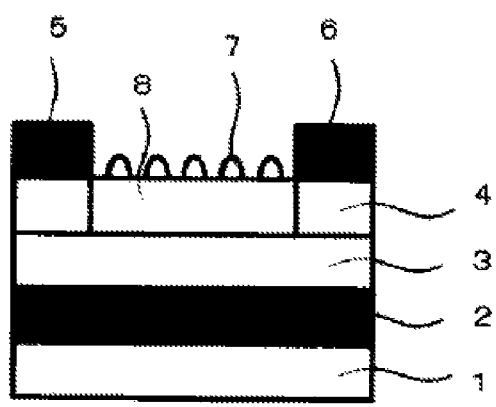
FIG. 3 is a figure showing schematically an embodiment of a depletion type organic field effect transistor device according to the present invention.
Figure 4:
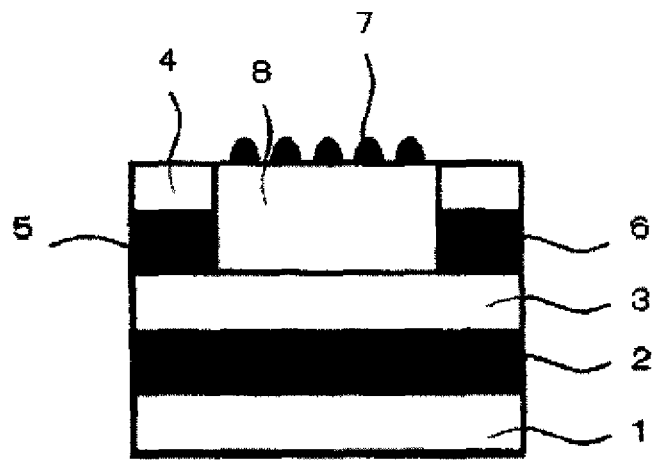
FIG. 4 is a figure showing schematically another embodiment of a depletion type organic field effect transistor device according to the present invention.

FIG. 3 shows an outlined cross section of an organic field effect transistor having a depletion layer according to the present invention. This organic field effect transistor has a structure that film gate electrode 2, gate insulation layer 3 and organic semiconductor layer 4 are stacked on substrate 1 in turn, and subsequently a pair of film-like source electrode 5 and film-like drain electrode 6 is formed on organic semiconductor layer 4 and then reductive material 7 is deposited on an upper portion of the organic field effect transistor so as to form depletion layer 8 in organic semiconductor layer 4. The structure or form of the organic field effect transistor shown in FIG. 3 is one example of the present invention, which is not limited to that embodiment. For example, the present invention may be the embodiment shown in FIG. 4 in which numerals 1-8 indicate the same as in FIG. 3. Structures of the organic field effect transistors are not limited in particular.

In the organic field effect transistor of the present invention, substrate 1 is used to make the organic field effect transistor free-standing. A material for substrate 1 is not limited especially and various substrates like glass substrates, various resin substrates or semiconductor substrates such as Si and so on can be suitably used. Here, the Si substrate is preferably used in view of processability and mechanical strength of the substrate. Further, a resin with good flexibility such as polyethylene naphthalate (PEN) is preferably used in an application such as an electronic paper. Although substrate 1 and gate electrode 2 are formed using different materials or as being different parts in the embodiments shown in FIGS. 1-4, gate electrode 2 may provide a role of the substrate simultaneously by making a free-standing film with sufficient thickness in view of securing free-standing ability of the organic field effect transistor.

Gate electrode 2 is an electrode used to control current between the source and the drain. A material for gate electrode 2 is not limited in particular as far as it is electrically conductive. For example, preferable materials include metallic materials such as chrome (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), tin (Sn), lithium (Li), and calcium (Ca), oxides of these metals, indium-tin oxide (ITO), zinc oxides (ZnO) and conventionally known conductive polymers such as conductive polyanilines, conductive polypyrroles, and conductive polythiazyls.

When substrate 1 is used, the thickness of gate electrode 2 is not especially limited. In general, the thickness is 10 nm to 150 nm. When gate electrode 2 doubles as substrate 1, gate electrode 2 is preferably 10 μm to 0.5 mm in thickness to secure sufficient free-standing ability.

Gate insulation layer 3 is disposed between gate electrode 2 and organic semiconductor layer 4. A material for composing gate insulation layer 3 is not limited in particular as far as it has an insulating function. Specifically, examples of the gate insulation layers include a film made of metallic oxide such as silicon oxide ($SiO_2$), aluminum oxide ($Al_2O_3$) and tantalum pentoxide ($Ta_2O_5$) and an insulating layer made of at least one organic compound such as poly(vinylphenol), polyimide, poly(vinylalcohol), polyethylene, poly(ethyleneterephthalate), poly(vinylidenedifluoride), poly(methylmethacrylate), polycarbonate, poly(ethylenefluoride), polystyrene, polyxylylene, cellulose, pullulan, and CYTOP (trademark of Asahi Glass Co., Ltd.). Especially, in the case of using a Si substrate which is suitable to double as gate electrode 2, $SiO_2$ formed by oxidizing its surface can be used as gate insulating layer 3.

Gate insulating layer 3 is not limited in thickness especially as far as it is able to insulate the source electrode from the gate electrode. The thickness is usually 100 nm to 1,000 nm.

When $SiO_2$ is used as gate insulating layer 3, it is preferable to treat a surface of gate insulating layer 3 so as to make it hydrophobic since the organic semiconductor material forming organic semiconductor layer 4 in the present invention is highly hydrophobic. Such a treatment of making $SiO_2$ hydrophobic causes a trap level to decrease at an interface of gate insulation layer 3 and organic semiconductor layer 4, and consequently the transistor characteristics are improved. There is no limitation in particular on a method of making $SiO_2$ hydrophobic, and conventionally known methods may be used. Preferably, it is a method using silane coupling agents. Specifically, there is exemplified a method of making $SiO_2$ hydrophobic by soaking a $SiO_2$ substrate in a solution of alkyl trichloro silane ($R$—$SiCl_3$) or alkyl trialkoxy silane, curing and rinsing.

When the substrate is made of resins such as poly(ethylenenaphthalate) (PEN), there is an advantage that the substrate can be preferably used as gate insulating layer 3 without any specific preliminary processing since the substrate is highly hydrophobic.

In the present invention, there is preferably used homopolymers or copolymers of organic compounds having a conjugated structure in the molecule as a conjugated polymer forming organic semiconductor layer 4. For instance, the conjugated polymers include homopolymers or copolymers of thiophenes, phenylenes, phenylenevinylenes, pyridines, benzothiazoles, fluorenes and derivatives thereof. Preferable conjugated polymers include polythiophene, polyphenylene, polyphenylenevinylene, polyfluorene, copolymers composed of at least two monomers selected from monomers constituting the homopolymers mentioned above and derivatives thereof. In particular, polythiophene derivatives are preferable.

A method of forming organic semiconductor layer 4 on gate insulating layer 3 is not limited in particular, and there can be used conventionally known methods of making or laminating a film. For instance, there are exemplified a method of forming a film using the organic semiconductor material dissolved in an appropriate solvent by conventionally known coating techniques such as cast coating, spin coating, an inkjet method and a laser deposition method (hereafter, the method may be abbreviated as coating method) or a method of forming a film in vapor phase such as vacuum deposition and so on.

The coating method mentioned above has advantages that it facilitates to reduce a production cost and increase a production scale since it can be carried out by simple equipment. In the coating method, solvent is not limited in particular as far as it can dissolve the polymer used in the present invention in an appropriate concentration, and specifically, as the solvent, there are exemplified a halogenated alkyl solvent such as chloroform and 1,2-dichloroethane; an aromatic solvent such as toluene, o-dichlorobenzene, nitrobenzene and m-cresols; N-methylpyrolidone; and carbon disulfide.

Source electrode 5 and drain electrode 6 are a pair of film-like electrodes disposed on organic semiconductor layer 4. There can be supplied current from source electrode 5 to drain electrode 6 through organic semiconductor layer 4. A material for making source electrode 5 and drain electrode 6 is not limited in particular as far as it is an electrically conductive material, and there are exemplified the same materials as in the case of gate electrode 2 mentioned above. Of those, materials having low electrical resistance at a contact interface with organic semiconductor layer 4 are preferable. Specifically, there are exemplified Cu, Ag, Pt and Au. In particular, Au is more preferable since it is chemically stable and is low in catalytic activities.

As a method of making these electrodes, there are exemplified a method of forming the electrodes by arranging a shadow mask on the organic semiconductor layer, subsequently performing vacuum deposition or sputtering of the above-mentioned metal used as a raw material, a method of forming the electrodes by making a thin film of the above-mentioned metal used as a raw material by vacuum deposition or sputtering, subsequently applying to the thin film conventionally known techniques such as a photolithograph method and lift-off method, a method of etching the metallic thin film using resists coated by an inkjet method or the like, and a method of transcribing the metallic thin film thermally on the organic semiconductor layer. Also, there may be used a method of patterning directly conductive polymers dissolved in a solvent or dispersed in a medium or conductive fine particles dispersed in a medium by an inkjet method and a method of forming the electrodes from a coated film by a lithograph method, laser deposition method or the like.

In the present invention, reductive material 7 is deposited on organic semiconductor layer 4 or mixed in organic semiconductor layer 4. Also, as reductive material 7, it is preferable to select a metal with as low of a work function as possible. A preferable work function value is 4.3 eV or less. Specifically, as the metals with a low work function, there are exemplified Ag (4.26 eV), Al (4.06, 4.28 eV), Ba (2.52 eV), Ca (2.9 eV), Ce (2.9 eV), Cs (1.95 eV), Er (2.97 eV), Eu (2.5 eV), Gd (3.1 eV), Hf (3.9 eV), In (4.09 eV), K (2.28 eV), La (3.5 eV), Li (2.93 eV), Ng (3.66 eV), Na (2.36 eV), Nd (3.2 eV), Rb (4.25 eV), Sc (3.5 eV), Sm (2.7 eV), Ta (4.0, 4.15 eV), Y (3.1 eV), Yb (2.6 eV) and Zn (3.63 eV). Aluminum and indium are preferable in particular.

Further, in the present invention, the reductive material is preferably a metal with a work function value being at least 0.5 eV lower than the ionization potential of the above-mentioned conjugated polymer used as the organic semiconductor layer.

When the reductive material forms a continuous film by itself, there may be short-circuits between a source electrode and a drain electrode due to electric conductivity of the reductive material. Therefore, it is preferable to make a discontinuous film of the reductive material. The film is preferably 10 nm or less, more preferably 7 nm or less, most preferably about 2 nm in an average thickness.

The p-type semiconductor made of a conjugated polymer used for organic semiconductor layer 4 is contacted with a metal having a low work function such as aluminum to form Schottky contact at their interface. Then, depletion layer 8 is formed at the interface. That is, electrons moving from the metal such as aluminum through the interface bind with acceptor ions that are impurities in the organic semiconductor layer so as to nullify the acceptor ions. Consequently, it becomes possible to suppress the influence of the impurities. Also, when the depletion layer is formed so as to have the same thickness as the organic semiconductor layer, a very high insulating state can be achieved since whole channel regions become a depletion state. That is, since an off-current can be suppressed, it makes possible to form a normally off-state transistor. Further, because depletion layer 8 changes from a high insulating state to a conductive state by adding gate voltage, steep subthreshold characteristics can be achieved. In the present invention, the definition "organic semiconductor layer made of a conjugated polymer having a depletion layer" includes the embodiments mentioned above.

In fabricating an organic electric field effect transistor of the present invention, at the beginning, a gate insulating layer is formed on a surface of a gate electrode, and subsequently an organic semiconductor layer is formed thereon. A source electrode and a drain electrode may be formed subsequent to forming the organic semiconductor layer or treating operations set forth below to the organic semiconductor layer. Also, they can be formed on the gate insulating layer prior to forming the organic semiconductor layer. The latter is easier in fabricating the electrodes and does not deteriorate the organic semiconductor layer due to heating or the like upon fabricating the electrodes. Further, all steps for stacking films may be reversed. The organic semiconductor layer may be formed in a region containing at least a channel region between the source electrode and the drain electrode. In the present invention, the organic electric field effect transistor may comprise wiring and protective films used conventionally to make an electric device in addition to the organic semiconductor, the source electrode, the drain electrode, the gate insulating layer and the gate electrode set forth above.

The organic electric field effect transistor of the present invention can be fabricated according to usual methods in the conventional art. For example, in order to make an electrode, there can be used vapor deposition or sputtering and mask deposition or a lithography method for making a pattern. Also, there can be used a method of forming a film by coating a silver paste containing a silver powder, a binder resin and solvent using squeeze printing, coating, an inkjet method or the like. The gate insulating layer can be formed by oxidizing thermally a whole surface of the gate substrate, sputtering on the gate substrate or anode-oxidizing gate metals or by making an organic insulating layer using vapor deposition, spin coating, squeeze printing, a coating method, an inkjet method or the like. The organic semiconductor layer can be formed by a method to make a thin film such as spin coating, a coating method or an inkjet method using the conjugated polymer solution.

As means for sealing a device, there can be used a filament CVD method using an inorganic film; a vapor deposition or a vapor deposition polymerization method using an organic film; or a spin coating method or a laminating method using a polymer. Except for a process of heat-treatment upon polymerization, the process temperature is from room temperature to 100° C. at most in each method. An increase of the substrate temperature depends on a passive temperature increase upon deposition of a metal. Therefore, the sealing step is carried out at a low temperature overall and is suitable for film substrates. Metallic wirings are arranged to connect to the source electrode, the drain electrode and the gate electrode.

EXAMPLE

Hereafter, the present invention will be explained specifically with reference to examples.

Example 1

A silicon wafer with an oxidized film of 300 nm in thickness was used as a gate insulating film and a gate electrode. The surface of the oxidized film was treated by octyltrichlorosilane so as to make it hydrophobic. An organic semiconductor layer made of polythiophene derivative (PT) was formed on the surface by spin-coating a solution dissolving PT in organic solvent, chloroform. The layer had about 20 nm in thickness. Then, a source electrode and a drain electrode were formed by depositing gold under vacuum with a thickness of about 50 nm on the PT thin film. According to this process, a typical organic transistor device shown in FIG. 1 was obtained.

Aluminum (Al) was deposited under vacuum on the above-mentioned device so as to have an average film thickness of 2 nm measured by a monitor using a quartz vibrator. Thus, there was provided a depletion type organic transistor device shown in FIG. 3 containing an organic semiconductor layer with a depletion layer as a component thereof.

Figure 5:
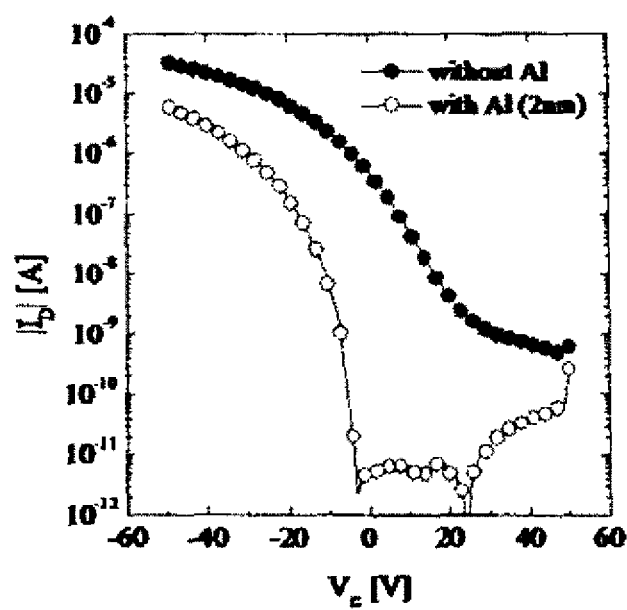
FIG. 5 is a graph showing transmission characteristics of a device using aluminum as a reductive material according to the present invention compared with one of a conventional device.

Regarding two devices fabricated in the manner mentioned above, transistor characteristics were evaluated. FIG. 5 shows transmission characteristics of these devices. The typical organic transistor device transfers gradually to an on-state at +20V in gate voltage VG (see the black circle in the figure) and has an off current value being in a nA level and an on-off ratio of about 4 digits. In contrast, the depletion type organic transistor device of the present invention maintains a complete off-state at 0V in gate voltage VG (see the white circle in the figure) and transfers steeply to an on-state at about −5V in gate voltage VG. Further, an off current value is in a pA level which means a very high insulating property and an on-off ratio increases to about 7 digits.

Example 2

A silicon wafer with an oxidized film of 300 nm in thickness was used as a gate insulating film and a gate electrode. The surface of the oxidized film was treated by octadecyl-trichlorosilane so as to make it hydrophobic. An organic semiconductor layer made of poly(3-hexyl-thiophene) (P3HT) was formed on the surface by spin-coating a solution dissolving P3HT in organic solvent, chloroform. The layer had about 20 nm in thickness. Then, a source electrode and a drain electrode were formed by depositing gold under vacuum with a thickness of about 50 nm on the P3HT thin film. According to this process, a typical organic transistor device shown in FIG. 1 was obtained.

Indium (In) was deposited under vacuum on the above-mentioned device so as to have an average film thickness of 2 nm measured by a monitor using a quartz vibrator. Thus, there was provided a depletion type organic transistor device shown in FIG. 3 containing an organic semiconductor layer with a depletion layer as a component thereof.

Figure 6:
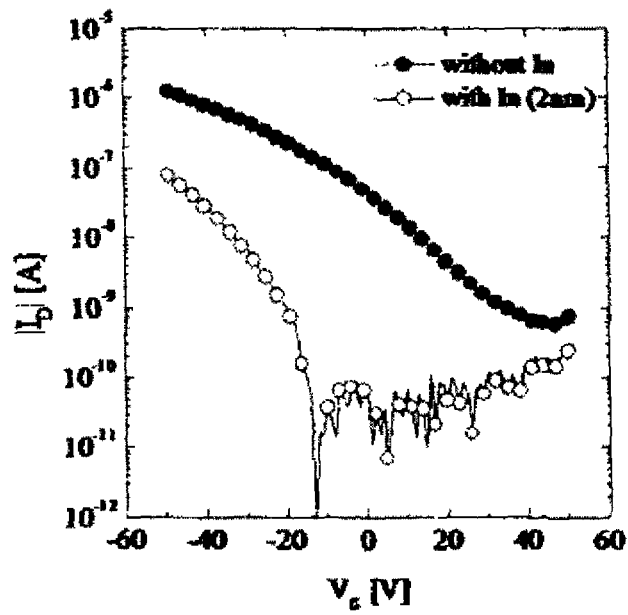
FIG. 6 is a graph showing transmission characteristics of a device using indium as a reductive material according to the present invention compared with one of a conventional device.

Regarding two devices fabricated in the manner mentioned above, transistor characteristics were evaluated. FIG. 6 shows transmission characteristics of these devices. The typical organic transistor device transfers gradually to an on-state at +40V in gate voltage VG (see the black circle in the figure) and has an off current value being in a nA level and an on-off ratio of about 3 digits. In contrast, the depletion type organic transistor device of the present invention maintains a complete off-state at 0V in gate voltage VG (see the white circle in the figure) and transfers steeply to an on-state at about −10V in gate voltage VG. Further, an off current value is in a pA level which means a very high insulating property and an on-off ratio increases to about 4 digits.

Example 3

A silicon wafer with an oxidized film of 300 nm in thickness was used as a gate insulating film and a gate electrode. An organic semiconductor layer made of poly(3-hexylthiophene) (P3HT) was formed on the surface by spin-coating a solution dissolving P3HT in organic solvent, chloroform. The layer had about 20 nm in thickness. Then, a source electrode and a drain electrode were formed by depositing gold under vacuum with a thickness of about 50 nm on the P3HT thin film. According to this process, a typical organic transistor device shown in FIG. 1 was obtained.

Aluminum (Al) was deposited under vacuum on the above-mentioned device so as to have an average film thickness of 0.5, 1.0, 2.0, 5.0 or 10 nm, respectively, measured by a monitor using a quartz vibrator. Thus, there were provided depletion type organic transistor devices shown in FIG. 3 containing an organic semiconductor layer with a depletion layer as a component thereof. Dependence of transistor characteristics on an average film thickness of the reductive material deposited on the device was evaluated.

Figure 7:
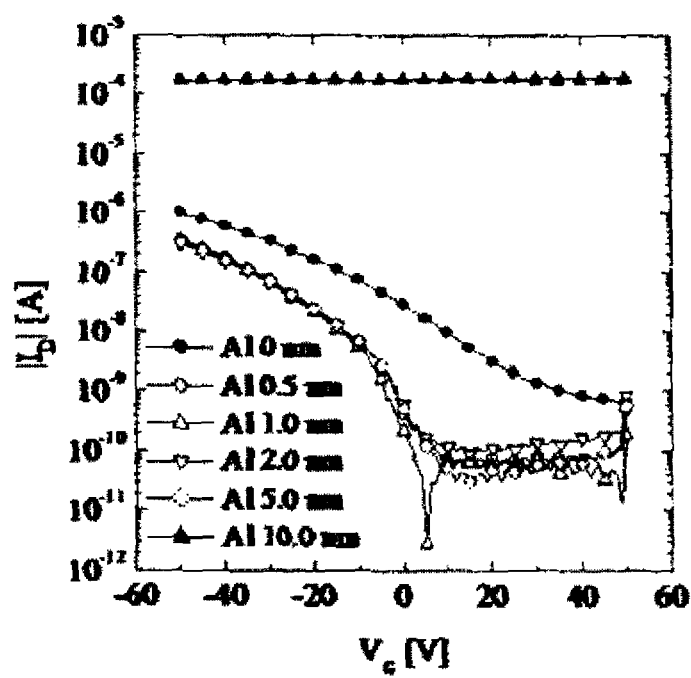
FIG. 7 is a graph showing and comparing transmission characteristics of devices according to the present invention upon varying thickness of aluminum film used as a reductive material.

Regarding devices fabricated in the manner mentioned above, transistor characteristics were evaluated. FIG. 7 shows transmission characteristics of these devices. The typical organic transistor device transfers gradually to an on-state at +40V in gate voltage VG and has an off current value being in a nA level and an on-off ratio of about 3 digits. In contrast, the depletion type organic transistor device with 0.5, 1.0, 2.0 or 5.0 nm in thickness of the present invention maintains a complete off-state at 0V or more in gate voltage VG and transfers steeply to an on-state at about 0V in gate voltage VG. Further, an off current value is in a pA level which means very high insulating properties and an on-off ratio increases to about 4 digits.

In the case of the depletion type organic transistor device having aluminum film with an average thickness of 10 nm, the drain current of several hundreds µA always flows regardless of the gate voltage value. This fact shows that the space between the source electrode and the drain electrode is short-circuited by Al deposited. Therefore, it is preferable that reductive materials deposited on the device forms a discontinuous film of 10 nm or less, more preferably 7 nm or less, in an average thickness.

INDUSTRIAL APPLICABILITY

An organic field effect transistor of the present invention uses a conjugated polymer having flexibility for a semiconductor layer and enables to achieve transistor properties at the same level as the low molecular organic semiconductor. Therefore, it is expected to be used for a flexible display or the like.

The invention claimed is:

1. An organic field effect transistor comprising an organic semiconductor layer constituting a current path between a source electrode and a drain electrode wherein the organic semiconductor layer is made of a conjugated polymer having a depletion layer, and a conductivity of the organic semiconductor layer is controlled by using a gate electrode, and a gate insulation layer is disposed between the gate electrode and the organic semiconductor layer, wherein the depletion layer is formed by contacting a reductive material being capable of forming Schottky contact with the organic semiconductor layer made of the conjugated polymer, wherein the reductive material is deposited on the organic semiconductor layer with an average film thickness of 10 nm or less.

2. The organic field effect transistor of claim 1, wherein the conjugated polymer is at least one polymer selected from the group consisting of polythiophene, polyphenylene, polyphenylenevinylene, polyfluorene, copolymers made from at least two monomers selected from the group consisting of thiophenes, phenylenes, phenylenevinylenes and fluorenes, and derivatives thereof.

3. The organic field effect transistor of claim 1, wherein the reductive material forms a discontinuous film.

4. The organic field effect transistor of claim 1, wherein the reductive material is a metal with a work function being at least 0.5 eV lower than an ionization potential of the conjugated polymer.

5. The organic field effect transistor of claim 4, wherein the reductive material is aluminum.

6. The organic field effect transistor of claim 5, wherein aluminum is deposited on the organic semiconductor layer with an average film thickness of about 2 nm.

7. The organic field effect transistor of claim 4, wherein the reductive material is indium.

8. The organic field effect transistor of claim 7, wherein indium is deposited on the organic semiconductor layer with an average film thickness of about 2 nm.

* * * * *